United States Patent
Rice et al.

(10) Patent No.: US 9,970,713 B2
(45) Date of Patent: May 15, 2018

(54) THERMOSIPHON SYSTEMS FOR ELECTRONIC DEVICES

(71) Applicant: Google LLC, Mountain View, CA (US)

(72) Inventors: Jeremy Rice, Austin, TN (US); Jeffrey S. Spaulding, Sunnyvale, CA (US); Huan D. Nguyen, Mountain View, CA (US)

(73) Assignee: Google LLC, Mountain View, CA (US)

( * ) Notice: Subject to any disclaimer, the term of this patent is extended or adjusted under 35 U.S.C. 154(b) by 215 days.

(21) Appl. No.: 14/967,022

(22) Filed: Dec. 11, 2015

(65) Prior Publication Data

US 2016/0097602 A1    Apr. 7, 2016

Related U.S. Application Data

(63) Continuation of application No. 13/548,046, filed on Jul. 12, 2012.

(51) Int. Cl.
*F28D 15/00* (2006.01)
*H05K 7/20* (2006.01)
(Continued)

(52) U.S. Cl.
CPC ......... *F28D 15/0266* (2013.01); *B23P 15/26* (2013.01); *F28D 15/0275* (2013.01); *F28F 1/40* (2013.01); *H01L 23/367* (2013.01); *H01L 23/4006* (2013.01); *H01L 23/427* (2013.01); *H05K 7/20809* (2013.01); *F28F 2013/006* (2013.01); *H01L 23/3675* (2013.01); *H01L 2023/4081* (2013.01); *H01L 2023/4087* (2013.01); *H01L 2924/0002* (2013.01); *Y10T 29/49393* (2015.01)

(58) Field of Classification Search
CPC ............... H01L 23/3675; H01L 23/367; H01L 23/4006; F28D 15/0275; F28D 15/0266
USPC ............ 165/104.19, 104.21, 104.22, 104.28, 165/104.33; 361/699, 700
See application file for complete search history.

(56) References Cited

U.S. PATENT DOCUMENTS 4,027,728 A   6/1977 Kobayashi et al.
4,274,479 A   6/1981 Eastman
(Continued)

FOREIGN PATENT DOCUMENTS

| CN | 1882237 | 12/2006 |
|---|---|---|
| CN | 102486355 | 6/2012 |
| JP | H03-51697 | 3/1991 |

OTHER PUBLICATIONS

Office Action issued in Chinese Application No. 201380030890.4 dated Nov. 3, 2017, 15 pages (English Translation).
(Continued)

*Primary Examiner* — Len Tran
*Assistant Examiner* — Paul Alvare
(74) *Attorney, Agent, or Firm* — Fish & Richardson P.C.

(57) ABSTRACT

A thermosiphon system includes a condenser, an evaporator, and a condensate line fluidically coupling the condenser to the evaporator. The condensate line can be a tube with parallel passages can be used to carry the liquid condensate from the condenser to the evaporator and to carry the vapor from the evaporator to the condenser. The evaporator can be integrated into the tube. The condenser can be constructed with an angled core. The entire assembly can be constructed using a single material, e.g., aluminum, and can be brazed together in a single brazing operation.

18 Claims, 9 Drawing Sheets

(51) Int. Cl.
*F28D 15/02* (2006.01)
*H01L 23/40* (2006.01)
*H01L 23/427* (2006.01)
*F28F 1/40* (2006.01)
*B23P 15/26* (2006.01)
*H01L 23/367* (2006.01)
*F28F 13/00* (2006.01)

(56) References Cited

U.S. PATENT DOCUMENTS

| | | |
|---|---|---|
| 5,076,351 A | 12/1991 | Munekawa |
| 5,694,295 A | 12/1997 | Mochizuki et al. |
| 5,737,923 A | 4/1998 | Gilley et al. |
| 5,966,957 A | 10/1999 | Malhammar et al. |
| 6,005,772 A | 12/1999 | Terao et al. |
| 6,073,683 A | 6/2000 | Okasabe et al. |
| 6,561,262 B1 | 5/2003 | Osakabe et al. |
| 6,725,908 B2 | 4/2004 | Suzuki |
| 6,840,311 B2 | 1/2005 | Ghosh et al. |
| 6,854,512 B2 | 2/2005 | Lee et al. |
| 6,874,567 B2 | 4/2005 | Ohara |
| 6,917,522 B1 | 7/2005 | Erturk et al. |
| 7,055,341 B2 | 6/2006 | Nori et al. |
| 7,154,749 B2 | 12/2006 | Stefanoski et al. |
| 7,246,655 B2 | 7/2007 | Mochizuki et al. |
| 7,497,249 B2 | 3/2009 | Bhatti |
| 7,525,801 B2 | 4/2009 | Luo |
| 7,556,086 B2 | 7/2009 | Joshi et al. |
| 2002/0023456 A1 | 2/2002 | Sone |
| 2002/0085356 A1 | 7/2002 | Ishimine |
| 2004/0163798 A1 | 8/2004 | Ghosh et al. |
| 2005/0161203 A1 | 7/2005 | Fang |
| 2005/0217829 A1 | 10/2005 | Belits |
| 2006/0000582 A1 | 1/2006 | Phillips et al. |
| 2006/0144565 A1 | 7/2006 | Tsai et al. |
| 2006/0196640 A1 | 9/2006 | Siu |
| 2006/0283577 A1 | 12/2006 | Liu et al. |
| 2006/0283579 A1 | 12/2006 | Ghosh |
| 2008/0236789 A1 | 10/2008 | Bhatti et al. |
| 2009/0078396 A1 | 3/2009 | Bhatti |
| 2010/0073863 A1 | 3/2010 | Matsushima |
| 2010/0154788 A1 | 6/2010 | Wells et al. |

OTHER PUBLICATIONS

Extended European Search Report issued in European Application No. 13816618.6 dated Jul. 20, 2016, 8 pages.
Bielinksi, Henryk et al., Computer Cooling Using a Two Phase Minichannel Thermosyphon Loop Heated from Horizontal and Vertical Sides and Cooled from Vertical Side, Archives of Thermodynamics, vol. 31 (2010), No. 4, pp. 51-59, Oct. 2010
International Search Report and Written Opinion from co-pending PCT Application No. PCT/US2013/049768, dated Oct. 23, 2013.
Publication entitles "3D-CFD Simulation and Neural Network" Jul. 2010, authored by M. Khoshvaght Aliabadi, M. Gholam Samani, F. Hormozi and A. Haghighi Asl.
Translation of Japanese Patent Document JPH 0351 697 A entitled Translation—JPH 0351697 A, [retrieved Jan. 6, 2017] 3 pages.
Office Action issued in Taiwanese Application No. 102124967, dated Mar. 29, 2017, 5 pages (English Translation).

THERMOSIPHON SYSTEMS FOR ELECTRONIC DEVICES

CROSS-REFERENCE TO RELATED APPLICATIONS

This application is a continuation of U.S. application Ser. No. 13/548,046, filed Jul. 12, 2012, the entire disclosure of which is incorporated by reference.

TECHNICAL FIELD

This invention relates to thermosiphon systems to remove heat from electronic devices.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, and other heat generating devices) that are located on a server rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

As noted above, electronic devices, e.g., computer components, such as processors and memories, generate heat. A thermosiphon system can be used to remove heat from such an electronic device. Although some systems have been proposed for removing heat from computer components, the limited space available in the server rack environment introduces an additional challenge to thermosiphon system design. In addition, for commercial applicability, the thermosiphon needs to operate with high efficiency.

Several approaches are described, which can be used individually or in combination in order to improve efficiency. A tube with parallel passages can be used to carry the liquid condensate from the condenser to the evaporator and to carry the vapor from the evaporator to the condenser. The evaporator can be integrated into the tube. The condenser can be constructed with an angled core. The entire assembly can be constructed using a single material, e.g., aluminum, and can be brazed together in a single brazing operation. The evaporator loading plate can apply pressure along a central axis.

In one aspect, a thermosiphon system includes a condenser, an evaporator, and a condensate line fluidically coupling the condenser to the evaporator. The condensate line includes a tube having a central passage and a pair of outer passages positioned on opposite lateral sides of the central passage and extending parallel to the central passage. The central passage is positioned to carry a vapor phase of the working fluid from the evaporator to the condenser. The pair of outer passages are positioned to carry a liquid phase of a working fluid from the condenser to the evaporator.

Implementations can include one or more of the following features. The tube may be a flattened rectangular body, the body having a width greater than its height. The outer passages may be positioned adjacent side walls of the rectangular tube. The central passage may extend from a top wall to a bottom wall of the rectangular tube. The tube may include a support strut positioned in the central passage and extending along a length of the tube. The pair of outer passages may have a cross-sectional area about 5-25% of the central passage. The tube may be a unitary brazed body. The evaporator may include an evaporator pan with a surface that is recessed relative to a bottom of the central passage. Each of the pair of outer passages may have an aperture positioned over or adjacent the evaporator pan. The evaporator may include a plurality of fins projecting upwardly from the evaporator pan.

In another aspect, a thermosiphon system includes a condenser, an evaporator, and a condensate line fluidically coupling the condenser to the evaporator. The evaporator includes an evaporator pan with a surface recessed relative to a floor of the condensate line, and a plurality of projections extending upwardly from the evaporator pan with tops of the fins positioned above the floor of the condensate line.

Implementations can include one or more of the following features. The plurality of projections may include a plurality of fins. The plurality of fins may be arranged substantially in parallel. The fins have undulations along their length. The undulations may have a pitch between 1 and 2 mm and an amplitude between 0.1 and 0.5 mm. A ceiling of the evaporator may be flush with a top of the central passage. The evaporator and the condensate line may be a unitary brazed body. The evaporator pan and the projections may be copper. The condensate line may be a tube having a central passage and a pair of outer passages positioned on opposite lateral sides of the central passage and extending parallel to the central passage, the central passage may be positioned to carry a vapor phase of the working fluid from the evaporator to the condenser, and the pair of outer passages may be positioned to carry a liquid phase of a working fluid from the condenser to the evaporator. Each of the pair of outer passages may have an aperture positioned over or adjacent the evaporator pan.

In another aspect, a thermosiphon system includes an evaporator, a condenser, and a condensate line. The condenser includes a body having a first side with an opening, a second side on the opposite side of the body from the first side, a central channel extending from the opening toward the second side, and a plurality of parallel chambers extending laterally from the central channel. A floor of the central channel and the plurality of parallel chambers is canted with an end of the central channel closer to the second side being higher than an end of the central channel at the opening. The condensate line fluidically couples the opening of the condenser to the evaporator.

Implementations can include one or more of the following features. The condensate line may include a tube having a central passage and a pair of outer passages positioned on opposite lateral sides of the central passage and extending parallel to the central passage, the central passage may be positioned to carry a vapor phase of the working fluid from the evaporator to the condenser, and the pair of outer passages may be positioned to carry a liquid phase of a working fluid from the condenser to the evaporator. The body may include a cavity and a plurality of walls that divide the cavity into the plurality of parallel chambers. A plurality of heat conducting fins may project outwardly from the body. The plurality of heat conducting fins may project vertically from the body. Tops of the plurality of heat conducting fins may lie in a horizontal plane. The floor of the central channel and the plurality of parallel chambers may be canted at an angle of 1°-30°, about 7.5°, relative to horizontal.

In another aspect, a method of assembling a thermosiphon system includes providing a condenser, an evaporator, and a condensate line, and simultaneously brazing the condenser, the evaporator, and the condensate line to form a unitary body in a single brazing process.

Implementations can include one or more of the following features. The condenser, the evaporator, and the condensate line may consist of aluminum. The condenser and the condensate line may consist of aluminum, and the evaporator may include a cooper evaporator pan. The single brazing process may be heating the condenser, the evaporator, and the condensate line simultaneously to a temperature of between about 580 and 620° C.

One or more of the following advantages may be realized. The thermosiphon system can fit within the limited horizontal and vertical space of the server rack. A thin layer of liquid can be maintained in the evaporator over the region where the evaporator contacts the electronic device, thus reducing thermal resistance of the evaporator to absorption of heat from the electronic device. Fins in the evaporator that project above the fluid level can improve heat transfer and/or reduce sensitivity to the angle of installation of the thermosiphon system. The angled core can enhance thermal performance by, among other things, exposing more of the condensate fins to vapor. The generally rectangular extruded tube can reduce the part count as compared to previous systems, thus reducing manufacturing cost and increasing yield. The single-material construction can also reduce manufacturing complexity, e.g., by allowing the entire system to be brazed as a single unit, which can decrease the likelihood of leaks. The generally rectangular extruded tube can provide a superior form factor, e.g., similar functionality with less space occupied by extraneous material.

The details of one or more implementations are set forth in the accompanying drawings and the description below. Other aspects, features, and advantages of the invention will be apparent from the description and drawings, and from the claims.

DESCRIPTION OF DRAWINGS

Like reference symbols in the various drawings indicate like elements.

DETAILED DESCRIPTION

This document discusses a thermosiphon system that can be implemented to remove heat from an electronic device, e.g., a component of computing equipment, such as a processor or memory. The evaporator of the thermosiphon system contacts the electronic device so that the electronic device experiences a conductive heat transfer effect. Thus, the thermosiphon system can act as a heat sink for the electronic device, reducing the likelihood of overheating and subsequent failure of the electronic device.

In particular, the thermosiphon system can be mounted on or integrated with a server rack sub-assembly for insertion into a server rack. The server rack sub-assembly can contain or support a number of heat-generating electronic devices, and the evaporator of the thermosiphon system can contact one or more of the electronic devices. In addition, the thermosiphon system can be mounted on a circuit card assembly, a daughter card, and/or other boards that carry heat-generating electronic devices.

Figure 1:
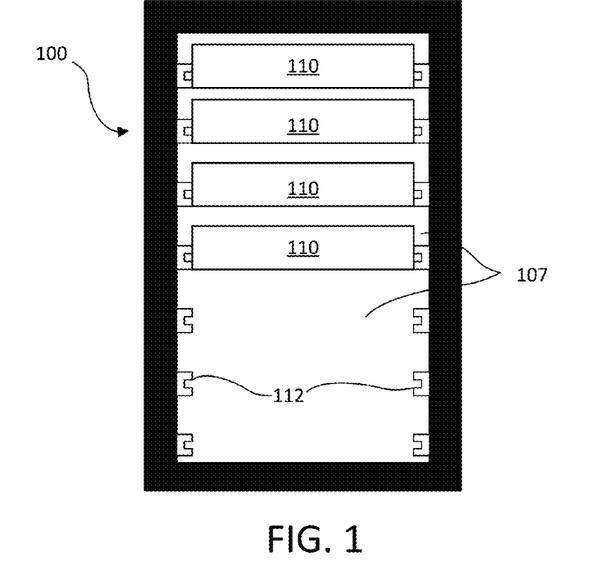
FIG. 1 illustrates a side view of a server rack and a server-rack sub-assembly configured to mount within the rack.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107. The slots, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2:
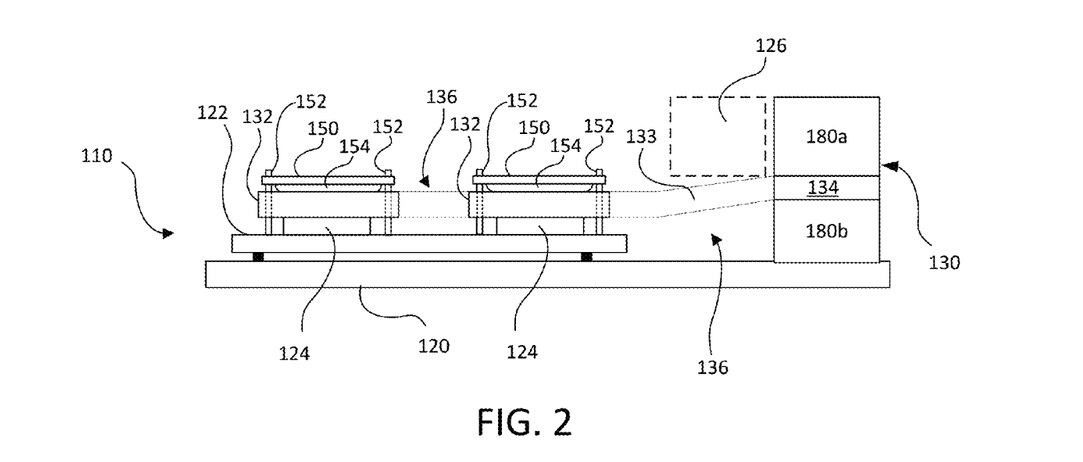
FIGS. 2 and 3 illustrate a side view and a top view of a server rack sub-assembly.
Figure 3:
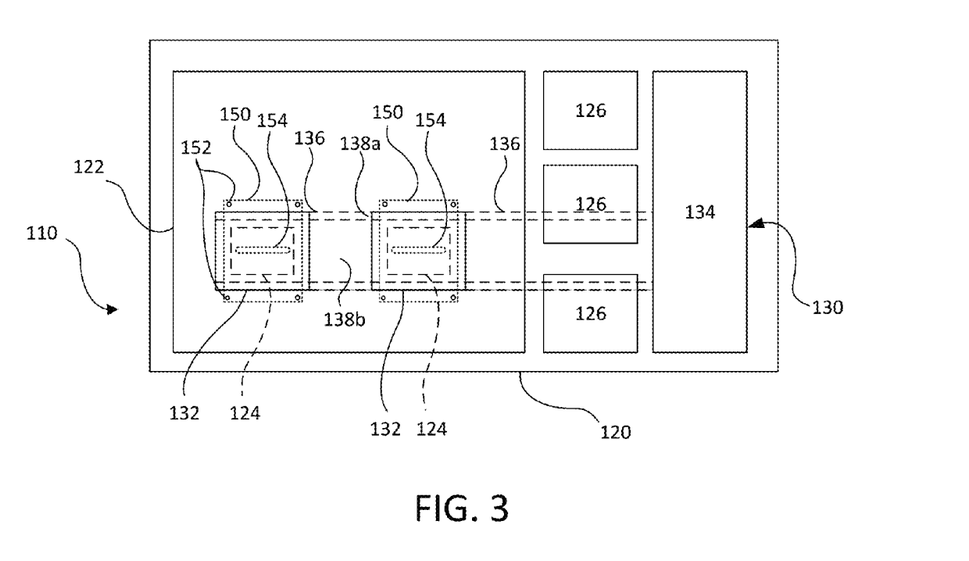
Figure 4:
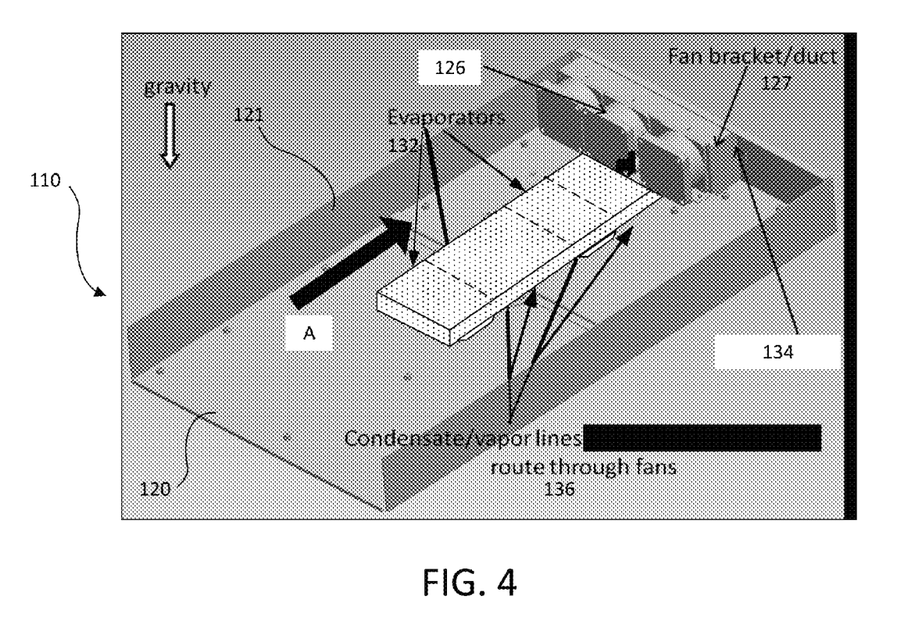
FIG. 4 illustrates a perspective view of a server rack sub-assembly (but omits the printed circuit board and heat generating elements to provide a view of more of the frame).

Referring to FIGS. 2, 3 and 4, the server rack sub-assembly 110 includes a frame or cage 120, a printed circuit board 122, e.g., a motherboard, supported on the frame 120, one or more heat-generating electronic devices 124, e.g., a processor or memory, mounted on the printed circuit board 122, and a thermosiphon system 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2 and 3 illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2 illustrates the frame 120 as a flat plate, the frame 120 can include one or more side walls 121 (see FIG. 4) that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIG. 3) of the server rack sub-assembly 110, closer to the front of the rack 105 when the sub-assembly 110 is installed in the rack 105, flows (see arrow A in FIG. 4) over the motherboard and over some of the heat generating components on the motherboard 122, and is exhausted from the server rack assembly 110 at the back edge (at the right hand side in FIG. 3), closer to the back of the rack 105 when the sub-assembly 110 is installed in the rack 105. The one or more fans 126 can be secured to the frame 120 by brackets 127. Thus, the fans 126 can pull air from within the frame 120 area and push the air after it has been warmed out the rack 105. An underside of the motherboard 122 can be separated from the frame 120 by a gap.

As shown in FIGS. 2-5, the thermosiphon system 130 includes an evaporator 132, a condenser 134, and a condensate/vapor line 136 connecting the evaporator region 132 to the condenser 134. The condensate/vapor line 136 includes at least two parallel passages, e.g., three parallel passages.

Figure 6:
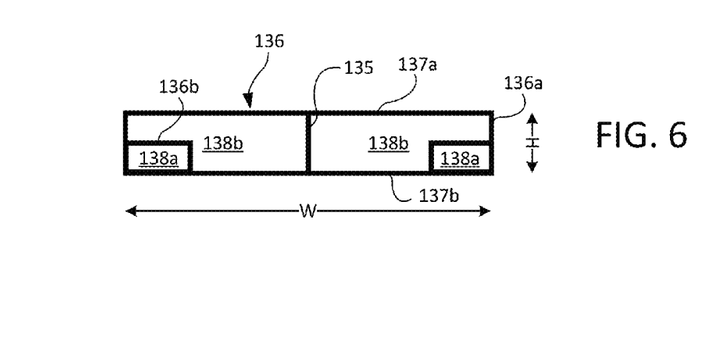
FIG. 6 illustrates a cross-sectional view of a condensate/vapor line, which can be a view taken along line 6-6 of FIG. 5.

In the implementation shown in FIG. 6, the condensate/vapor line 136 includes a central passage 138a and two outer passages 138b. The two outer passages 138b are positioned on opposite lateral sides of the central passage 138a and extend parallel to the central passage 138a. In particular, the outer passages 138b can be positioned adjacent to the side walls 136a of the tube that provides the condensate/vapor line 136. In addition, the outer passages 138b can be positioned adjacent the bottom floor of the tube that provides the condensate/vapor line 136. In operation, the central passage 138a carries a vapor phase of the working fluid from the evaporator 132 to the condenser 130, and the pair of outer passages 138b carry a liquid phase of the working fluid from the condenser 130 to the evaporator 132.

The condensate/vapor line 136 can be constructed as a flattened rectangular body, having a width W (measured perpendicular to the long axis of the evaporator) greater than its height H (measured perpendicular to the surface of the printed circuit board). As shown in FIG. 6, the evaporator 132 and the condensate/vapor line 136 can include a plurality of partitions, including two outer partitions 136b. The volume between each outer partition 136b and the side wall 136a and bottom wall 137b defines an outer passage 138b. The volume between the outer partitions 136b, between the top wall 137a and the bottom wall 137b, can define the central passage 138a.

In some implementations, the plurality of partitions also includes a central partition 135. The central partition 135 can extend from the top wall 137a to the bottom wall 137b of the condensate/vapor line 136. As shown in FIG. 6, the central partition 135 divides the central passage 138a into two or more passages. The central partition 135 can be a support strut that extends from the top wall 137a to the bottom wall 137b to provide improved structural strength and stability.

The pair of outer passages 138a, taken together, can be about 5-25% of the cross sectional area of the central passage 138b, e.g., each outer passage 138a be about one-third the width of the central passage 138b. The outer partitions 136a can be located on opposite lateral sides of the central partition 136b, and run parallel to the central partition 136b.

Returning to FIGS. 2, 5 and 6, the evaporator 132 contacts the electronic device 124 so that heat is drawn by conductive heat transfer from the electronic device 124 to the evaporator 132. In particular, the bottom of the evaporator 132 contacts the top of the electronic device 124. In operation, heat from the electronic device 124 causes a working fluid in the evaporator 132 to evaporate. The vapor then passes through condensate/vapor line 136, particularly through the central passage 138b, to the condenser 134. Heat is radiated away from the condenser 134, e.g., into air blown or drawn by the one or more fans 126 that pass across the condenser 134, causing the working fluid to condense. The condensed working fluid can flow back through the condensate/vapor line 136, particularly through the outer passages 138a, to the evaporator 132.

Figure 5:
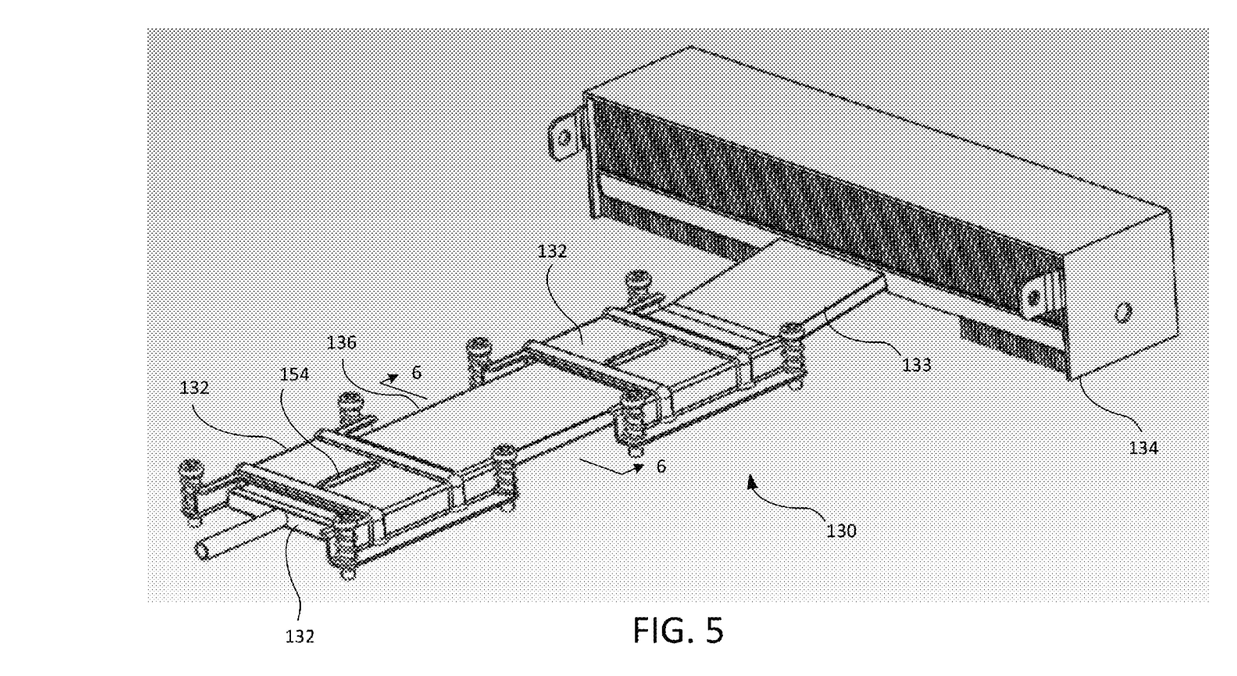
FIG. 5 illustrates a perspective view of a thermosiphon system.

The evaporator 132 can be put in thermal contact with the electronic device 124 by a mounting bracket 150 that applies urges the evaporator 132 towards the electronic device 124. The mounting bracket 150 can be attached to the printed circuit board 122 by fasteners 152.

Figure 7:
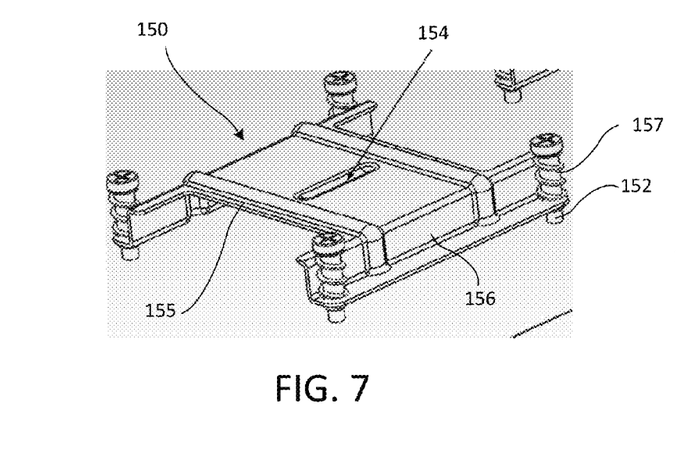
FIG. 7 is a perspective view of a mounting bracket.
Figure 8:
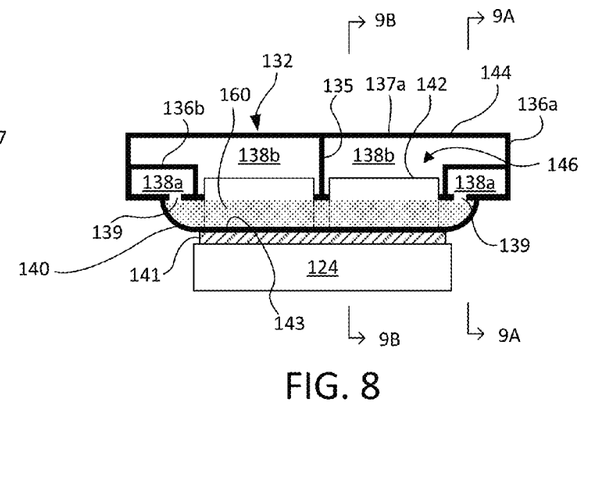
FIG. 8 illustrates a cross-sectional frontal view of an implementation of the evaporator.

Referring to FIGS. 2, 5, and 7, the mounting bracket, as mounted on the circuit board 122, can have a downwardly extending projection 154, e.g., a convex bump that applies a greater amount of pressure to the center of the evaporator 132. In some implementations, the projection 154 can be elongated, e.g., along the longitudinal axis of the condensate/vapor line 136. The projection 154 can span a length (measured parallel to the passages of the condensate/vapor line 136) of the evaporator 132. Additionally, the projection 154 can be centered across a width (measured perpendicular to the passages of the condensate/vapor line 136) of the evaporator 132. This configuration applies a greater amount of pressure along the center line of the evaporator, and can prevent the bottom of the evaporator 132 from bending away from the top of the electronic device 124. Maintaining good contact between the bottom of the evaporator 132 and the top of the electronic device 124 can improve cooling efficiency.

As shown in the implementation of FIGS. 5 and 7, the mounting bracket 150 includes a horizontally extending crosspiece 155. The downwardly extending projection 154 is formed on the bottom surface of the crosspiece 155. The crosspiece 155 extends horizontally between two side flanges 156 extend downwardly from the cross-piece 155. When installed on the circuit board 122, the side flanges 156 can sit on either side of the electronic device 124. Springs 157, which can bear against side flanges 56, urge the mounting bracket 150 downwardly.

As shown in FIGS. 2 and 3, the condenser 134 can be located on an opposite side of one or more of the one or more fans 126 from the evaporator 132. Alternatively or in addition, the condenser 134 can be located on a same side of one or more of the one or more fans 126 as the evaporator 132. The condensate/vapor line 136 can extend below the fans 126.

As shown in FIG. 2, a portion 133 of the condensate/vapor line 136 can be at a slight (non-zero) angle so that gravity causes the condensed working fluid to flow back through the condensate/vapor line 136 to the evaporator 132. The angle can be 1°-30°, e.g., 7.5°, relative to the relative to horizontal. Since the frame 120 is typically held horizontally in operation, the angle can be 1°-30° relative to the surface of the frame. Thus, in some implementations, at least a portion 133 of the condensate/vapor line 136 is not parallel to the main surface of the frame 120. For example, the condenser-side end of the condensate/vapor line 136 can be about 1-5 mm, e.g., 2 mm, above the evaporator-side end of the condensate/vapor line 136. However, it is also possible for the condensate/vapor line 136 to be horizontal, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIGS. 2 and 3, there is a first evaporator 132 and a second evaporator 132 as well as a first electronic device 124 and a second electronic device 124. The condensate/vapor line 136 connecting the first evaporator to the second evaporator can be level, or can have a slight positive angle (with the evaporator 132 and end of the tube 136 that is farther from the condenser 130 being lower than the other evaporator).

During operation, the top surface of the liquid inside the condenser will be above the top surface liquid height in the evaporator, e.g., by 1 to 10 mm. It can be easier to achieve this with a condensate/vapor line 136 that is at a slight (positive non-zero) angle, but proper selection of the thermal and mechanical properties of the working fluid in view of the expected heat transport requirements for the thermosiphon system may still achieve this for a condensate/vapor line 136 that is horizontal or at a slightly negative angle.

During operation, the liquid phase of a working fluid can fill at least a bottom portion of an interior volume of the outer passages 138a of the condensate/vapor line 136, with the bottom portion extending from the condenser to the evaporator region, and a vapor phase of the working fluid can pass through the central passage 138b of the condensate/vapor line 136. Furthermore, the liquid phase of the working fluid can flow from the outer passages 138a into the central passage 138b through one or more apertures 139. The liquid phase of the working fluid can fill at least a bottom portion of an interior volume of the condenser 124. Some portion of the outer passages 138a can carry vapor. Due to the separation of the central passage 138b from the outer passages 138a by the walls of the outer partitions 136a, shear stress between the liquid and the vapor phases of the working fluid flowing in opposite directions can be reduced, thus improving condensate flow to the evaporator and improving efficiency.

In some implementations, the condenser 134 can be located at a height above the evaporator 132 such that a liquid phase of the working fluid fills a portion of an interior volume of the condensate/vapor line 136, i.e., the outer passages 138a, and such that during operation a top surface of the liquid phase has at a non-zero angle relative to horizontal from the condenser 132 to the evaporator 134, and a vapor phase of the working fluid can pass through a portion of the interior volume of the condensate/vapor line 136, i.e., the central passage 138b, the portion extending from the condenser 132 to the evaporator 134.

FIGS. 2-4 illustrate a thermosiphon system 130 with multiple evaporators 132; each evaporator 132 can contact a different electronic device 124, or multiple evaporators 132 could contact the same electronic device, e.g., if the electronic device is particularly large or has multiple heat generating regions. As shown in FIGS. 2-4, the multiple evaporators 132 can be connected by the condensate/vapor lines 136 to the condenser 134 in series, i.e., a first condensate/vapor line connects the condenser to a first evaporator, and a second condensate/vapor line connects the first evaporator to a second evaporator. Alternatively, some or all of the multiple evaporators 132 can be connected by the condensate/vapor lines 136 to the condenser 134 in parallel, i.e., a first condensate/vapor line connects the condenser to a first evaporator, and a second condensate/vapor line connects the condenser 134 to a second evaporator. An advantage of a serial implementation is fewer tubes, whereas an advantage of parallel tubes is that the tube widths can be smaller.

FIGS. 2-4 and 6 illustrate a thermosiphon system 130 in which a flattened rectangular body having a central passage and a pair of outer passages positioned on opposite lateral sides of the central passage is used for the condensate flow from the condenser 134 to the evaporator 132 and for vapor flow from the evaporator 132 to the condenser 134. Thus, in this implementation the fluidical coupling between the evaporator 132 and the condenser 134 consists of the combined condensate and vapor transfer line. A potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 136 can be a tube or pipe, e.g., of copper or aluminum.

Furthermore, the condensate/vapor line 136 can be manufactured by a metal extrusion process. The complete assembly of condensate/vapor line 136 and condenser 124 can have a limited number of parts, e.g., the vapor line 135 is constructed as a flattened rectangular body, which can reduce the part count as compared to a similar system wherein the condensate/vapor line is not built as a flattened rectangular body. The reduction in part count can result in lower manufacturing complexity, lower manufacturing cost, and higher manufacturing yield.

FIGS. 8 and 9A-9E illustrate a thermosiphon system 130 in which the evaporator 132 includes a chamber 146 and a plurality of evaporator fins 142. The housing can include a base 140 and a case 144 that is secured to the base 140. The case 144 can be provided by the tube of the condensate/vapor line 136. An opening 145 can be formed in the bottom surface of the condensate/vapor line 136. The base 140 abuts the condensate/vapor line 136 and surrounds the opening 145. The opening 145 may be of the same shape as the base, e.g., square. The volume sealed above the base 140 inside the case 144 provides the chamber 146 for the condenser 132.

The top surface of the base 140 provides an evaporator pan 143. That is, the top surface 140 includes a portion i) that is recessed relative to the bottom of the central passage 138b, and ii) in which the liquid phase of the working fluid 160 collects. For example, the top surface of the evaporator pan can be recessed relative to the bottom of the central passage 138b by about 1 mm to 5 mm, e.g., 2 mm.

The evaporator fins 142 project upwardly from the evaporator plan 143 so that they are above the bottom of the central passage 138b. When the liquid phase of the working fluid overflows the evaporator pan 143, it floods the bottom section of the inner passage 138b. Thus, the bottom of the inner passage 138b can be considered a floodplain. In addition, this ensures that the evaporator fins 142 remain only partially submerged in the liquid phase of the working fluid.

The housing can be a flattened rectangular body, of the same outside dimensions as the outside dimensions of the condensate/vapor line 136. The housing can also comprise extensions of the outer passages 138a and the central passage 138b of the condensate/vapor line 136.

The base 140 can be formed of the same material as the housing, e.g., aluminum. Alternatively, the base 140 can be formed of a different thermally conductive material, e.g., copper. The housing, e.g., the bottom of the base 140, can directly contact the electronic device 124, e.g., the top surface of the electronic device 124. Alternatively, the housing, e.g., the bottom of the base 140, can be connected to the electronic device 124, e.g., the top surface of the electronic device 124, by a thermally conductive interface material 141, e.g., a thermally conductive pad or layer, e.g., a thermally conductive grease or adhesive.

The evaporator fins 142 contact the bottom interior surface of the housing, e.g., the top surface of the base 140. The evaporator fins project upwardly from the evaporator pan 143. Thus, the evaporator fins 142 provide a thermally conductive area that transfers heat from the base 140 to the working fluid 160. The tops of the fins 142 can project above the floor of the condensate/vapor line 136.

The fins can be arranged substantially in parallel. In some implementations, the fins extend generally parallel to the width of the central passage 136b, i.e., perpendicular to the length of the condensate/vapor line 136.

In addition, the evaporator fins 142 can be configured to draw the working fluid 160 away from the base 140 by capillary action. For example, the evaporator fins 142 can be stamped or otherwise imprinted with features, e.g., grooving, which tends to draw the working fluid upward.

Figure 9A:
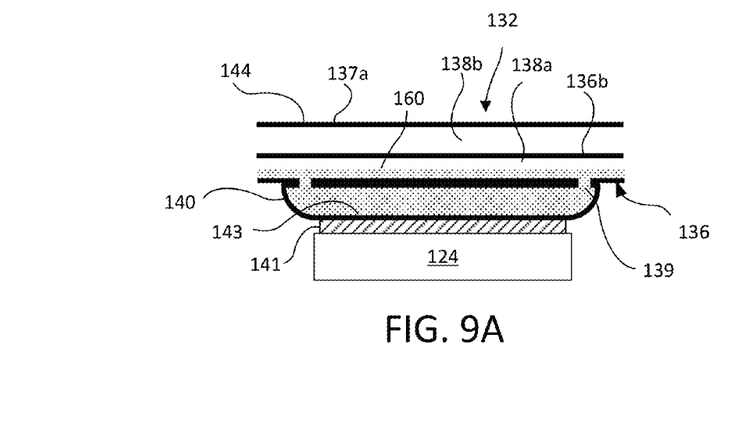
FIGS. 9A and 9B illustrate cross-sectional side views of an implementation of an evaporator from a thermosiphon system, which can be a view taken along lines 9A-9A and 9B-9B of FIG. 8, respectively.
Figure 9B:
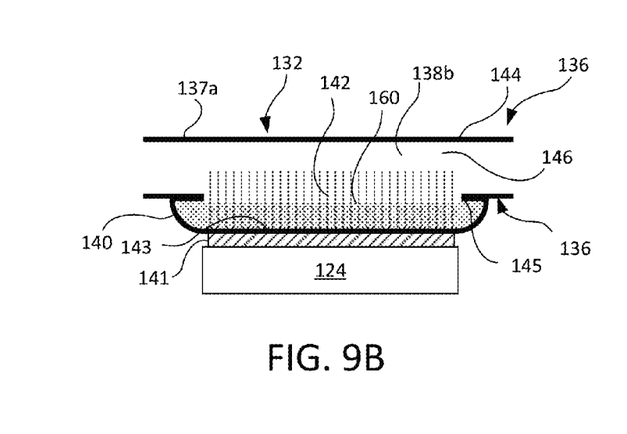
Figure 9C:
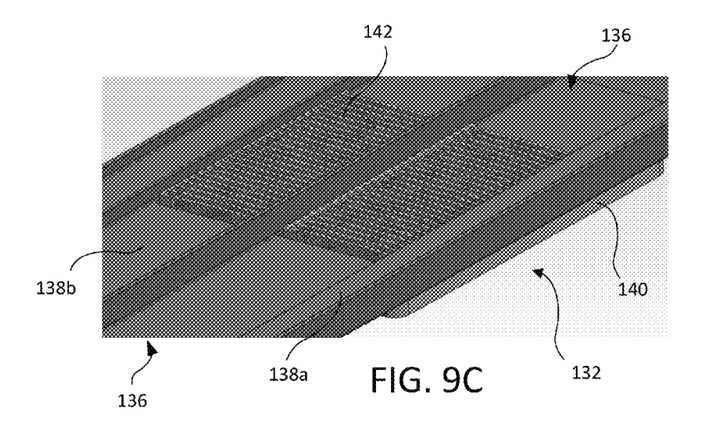
FIG. 9C illustrates an isometric cut-away view of the implementation of the evaporator of FIGS. 9A and 9B.
Figure 9D:
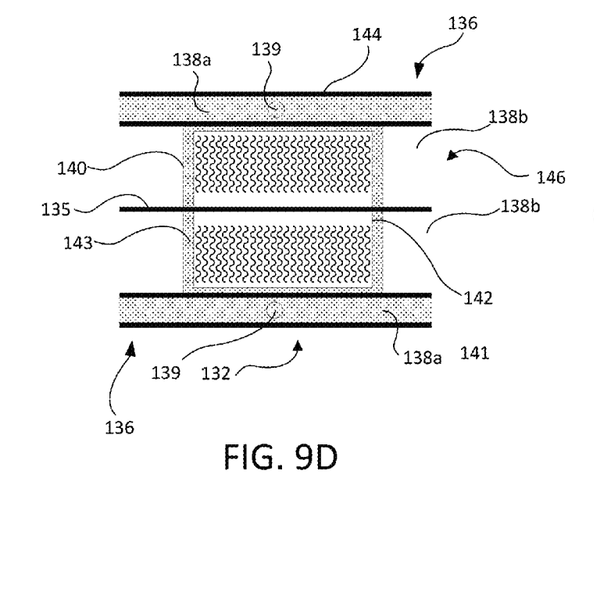
FIG. 9D illustrates a top view of the implementation of the evaporator of FIGS. 9A and 9B.
Figure 9E:
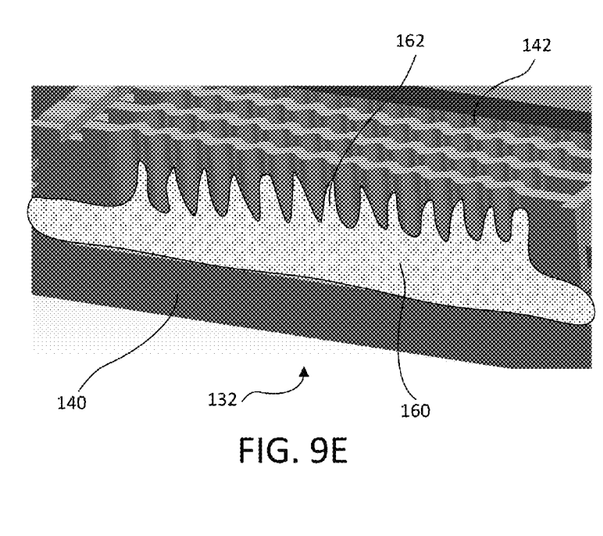
FIG. 9E illustrates a detailed view of an implementation of an evaporator fins in the implementation of the evaporator of FIGS. 6A and 6B.

In some implementations, the fins can have undulations along their length. The undulations can have a pitch between 1 mm and 2 mm and an amplitude between 0.1 and 0.5 mm. As shown in FIG. 9E, these undulations can cause some of the liquid phase of the working fluid 160 to move up the fins 142 by capillary action. This can improve the efficiency of the evaporator 132 by exposing more of the surface area of the fins 142 to the liquid phase of the working fluid.

The fins can be constructed of the same material as the evaporator, e.g., aluminum. Alternatively, the fins can be constructed of a different thermally conductive material, e.g., copper.

The chamber 146 can comprise extensions of the outer passages 138a and the central passage 138b. The top of the chamber 146 can be flush with the top of the central passage 138b. A plurality of apertures 139 are formed in the outer passages 138a in a region above the fins 142. Although FIGS. 9A and 9D illustrate two apertures 139, there could be more than two apertures.

In operation, the working fluid 160, in liquid form, flows from the outer passages 138a into the central passage 138b and the evaporator pan 143. The working fluid 160 can flow through the apertures 139 and onto the evaporator fins 142 (see FIGS. 9A, 9D and 9E). The working fluid can fill a volume between the base 140 and the bottom of the outer passages 138a, thereby forming a thin layer 162 of working fluid on the evaporator fins 142. In particular, the thin layer 162 can be formed in the valleys between the undulations of the fins. A remainder of the working fluid can flow down the outer passages 138a to another evaporator 132. By creating a thin layer 162 of the working fluid 160, the thermal resistance of the evaporator is effectively reduced (because the working fluid can evaporate more readily from a thin layer, permitting greater heat transfer).

Turning now to the condenser 132, the condenser 132 includes a plurality of chambers, and a plurality of heat conducting fins. The chambers can be parallel and vertically-extending. The top ends of the chambers can be closed off, i.e., there is no top header that interconnects the top ends of the chambers.

FIGS. 10-14 illustrate a first implementation of the condenser 134 that has a body 170 having cavity 174 formed therein, and a plurality of walls 172 in the cavity that divide the cavity 174 into a plurality of parallel vertically-extending chambers 174a. The chambers 174a can be parallel and vertically-extending. The top ends of the chambers 174a can be closed off, i.e., there is no top header that interconnects the top ends of the chambers 174a. The walls 172 act as a condensation surface and to conduct heat from the vapor, through the body to the fins.

The cavity 174 also includes a central channel 176 with an opening to the exterior of the body 170 which is coupled to the condensate line 136. The vertically-extending chambers 174a can extend laterally from the central channel 176, and the chambers 174a can extend parallel to the long axis of the body 170 (i.e., the body has a length greater than its width, and the long axis is along the length). The central channel 176 can extend laterally perpendicular to the long axis. When the condenser 134 is installed on the frame, the central channel 176 can run from the front toward the rear of the body 170. A first set of the vertically-extending chambers 174 can extend laterally from a first side of the central channel 176, and a second set of the plurality of vertically-extending chambers 174 can extend laterally from an opposite second side of the central channel 176. The body 170 can be a generally rectangular solid, although other shapes are possible.

This implementation of the condenser 134 that has a plurality of heat conducting fins 180 that project outwardly from the body 170. For example, the fins 180 can project vertically from the body 170. The fins 170 can be generally flat, narrow sheets. The fins 180 can project in parallel to each other from the body 170, and can be spaced apart with a regular pitch along a direction normal to their flat primary surfaces. In some implementations, the fins 180 include at least a first plurality of fins 180a that project upwardly from the top surface of the body 170. In some implementations, the fins 180 also include a second plurality of fins 180b that project downwardly from the bottom surface of the body 170.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis perpendicular to, or at a slight angle to, the long-axis of the chambers 174a and/or the body 170.

Returning to FIG. 2, the condenser 134 can rest on the frame 120, and the fins 180b that project downwardly from the bottom surface of the body 170 can project below the plane of the motherboard 122. This can improve the available surface area for the fins to improve radiating efficiency of the condenser 134. This can also assist in limiting the vertical height of the condenser 134 so that the thermosiphon system 130 is compatible with the limited height available in the server rack environment. For example, a total height from a bottom of the tray to a top of the heat conducting fins can be at most 6 inches, e.g., at most 4 inches.

Figure 10:
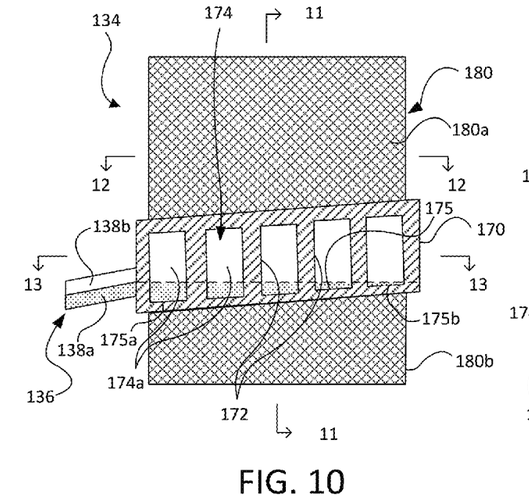
FIGS. 10 and 11 illustrate side views, cross-sectional, of a condenser from the thermosiphon system.
Figure 11:
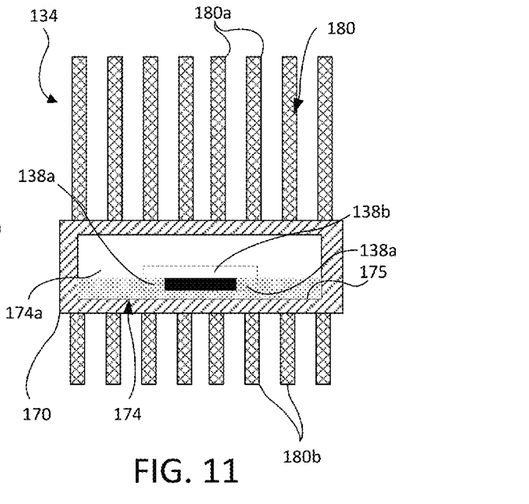
Figure 12:
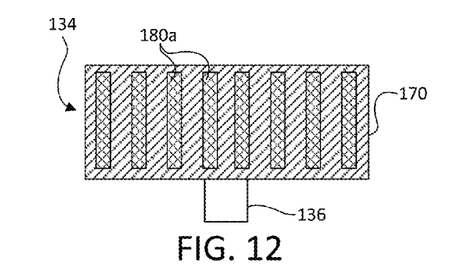
FIGS. 12 and 13 illustrate top views, cross-sectional, of the thermosiphon system of FIGS. 8 and 9.
Figure 13:
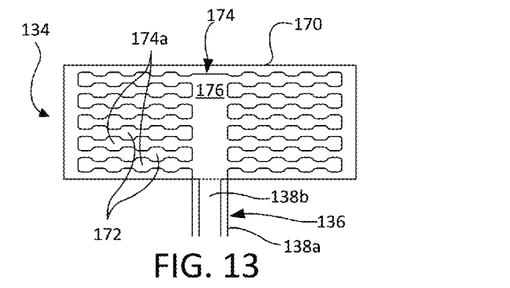
Figure 14:
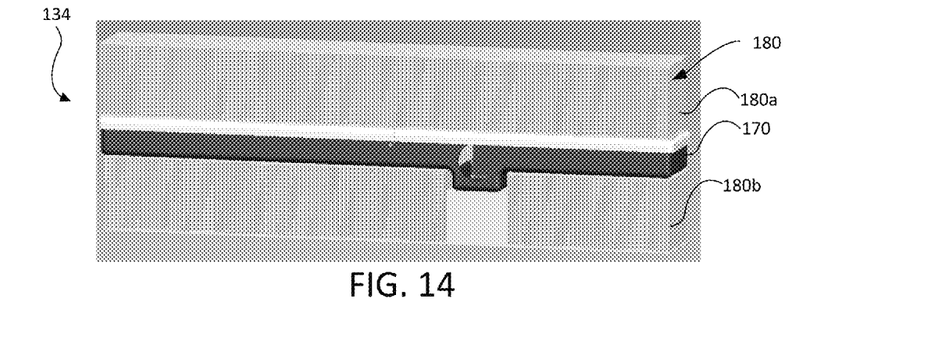
FIG. 14 illustrates a perspective view, cut away, of a condenser from the thermosiphon system.

As shown in the implementation of FIGS. 10 and 11, the outer passages 138a can connect to the cavity 174 of the condenser 134 at positions vertically lower than the central passage 138b. The bottom of the central passage 138b can be vertically level with the top of the outer passages 138a.

Referring to FIG. 10, the floor 175 of the cavity 174 can be sloped, with the side 175a abutting the condensate/vapor line 136 at a vertically lower position than the side 175b on the opposite side of the cavity 174 from the condensate/vapor line 136. The floor 175 of the cavity 174 can be sloped at an angle of 1°-30°, e.g., 7.5°, relative to horizontal. Since in operation the fins 180 typically project vertically, the floor 175 of the cavity 174 can be at angle of 60°-89° relative to fins 180. In some implementations, the floor 175 of the cavity 174 is sloped at the same angle as the portion 133 of the condensate/vapor line 136.

The fluid level and the vertical offset of the central passage 138b can be set such that the openings to the outer passages 138a are at least partially covered with liquid, and the opening to the central passage 138b is exposed only to vapor. The sloped floor 175 of the cavity 174 can cause the liquid phase of the working fluid to pool in the cavity 174 near the condensate/vapor line 136, which improves the likelihood that the entrances to the outer passages 138a remain covered by the liquid phase of the working fluid. Furthermore, the sloped floor 175 of the cavity 174 can increase the proportion of the vapor phase of the working fluid in the portion of the cavity 174 on the opposite end from the condensate/vapor line 136, thus keeping more of the fins 180 in that region exposed to the vapor phase of the working fluid.

Figure 15:
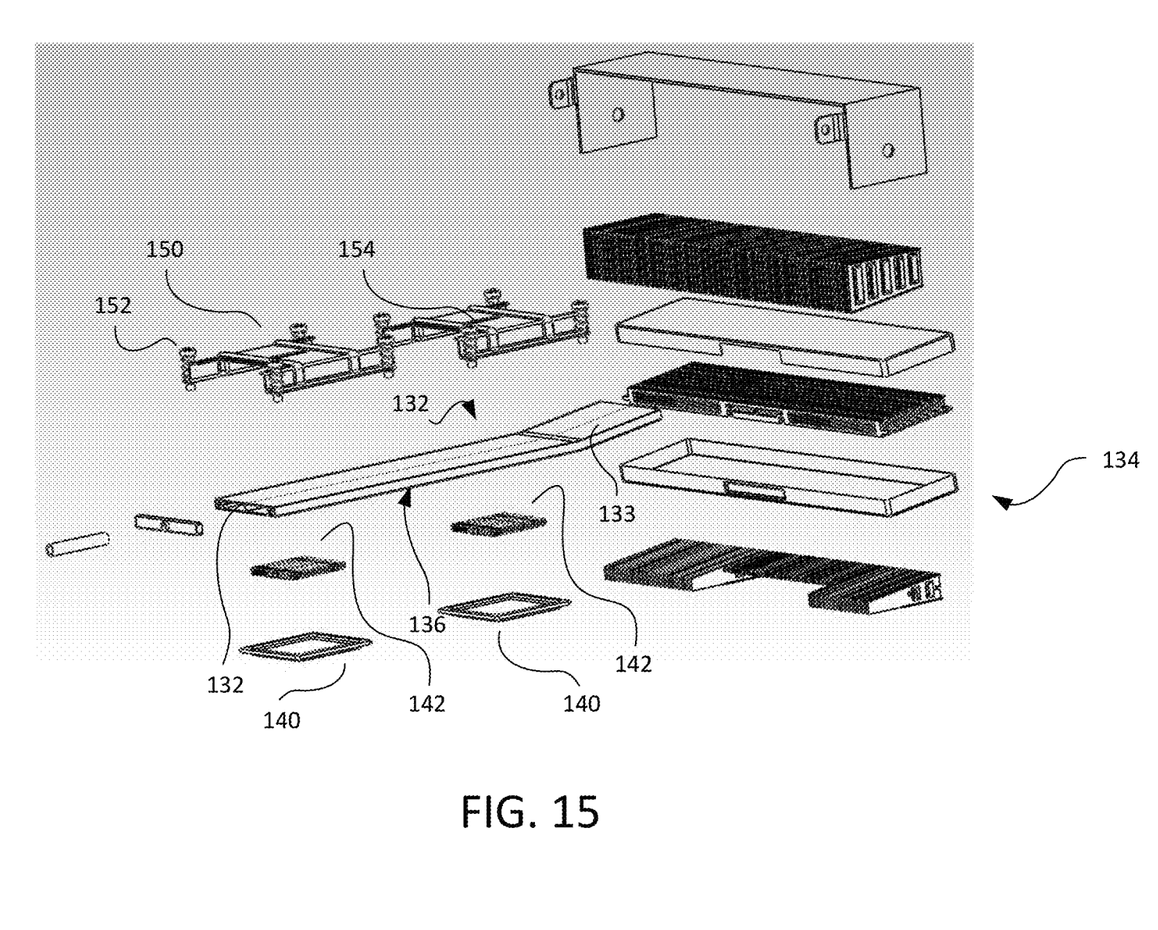
FIG. 15 illustrates an exploded perspective view of a thermosiphon system.

Referring to FIG. 15, the evaporator 132, the condenser 134, and the condensate/vapor line 136 can be constructed of the same material, e.g., aluminum. Constructing the evaporator 132, the condenser 134, and the condensate/vapor line 136 using the same material can reduce manufacturing complexity. For example, the evaporator 132, the condenser 134, and the condensate/vapor line 136 can be formed in a single brazing process, wherein all three parts are simultaneously heated to a temperature sufficient to braze the parts together. For example, for aluminum, all the parts can be heated to a temperature between about 580-620° C. This provides a unitary part that is less likely to develop leaks. In addition, reducing the number of brazing steps can reduce manufacturing cost.

Alternatively, a portion of the evaporator 132, e.g., a bottom floor of the evaporator which contacts the heat-generating electronic device 124, may be constructed of a different material, e.g., copper. This configuration can also reduce manufacturing complexity to some degree, as the condenser 134 and the condensate/vapor line 136 can still be formed together in a single brazing process.

Figure 16:
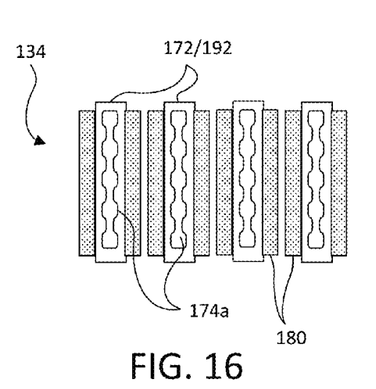
FIGS. 16 and 17 illustrate a top view and a side view, cross-sectional, of another implementation of a condenser.
Figure 17:
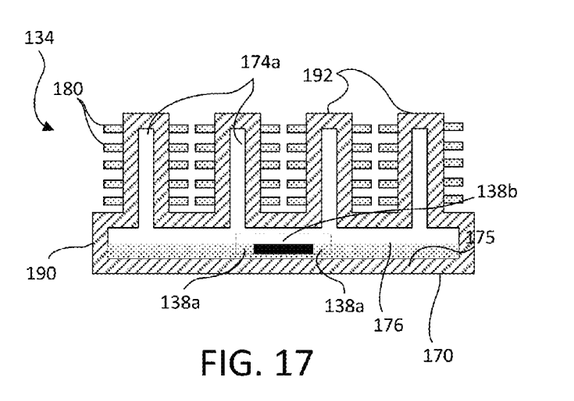
Figure 18:
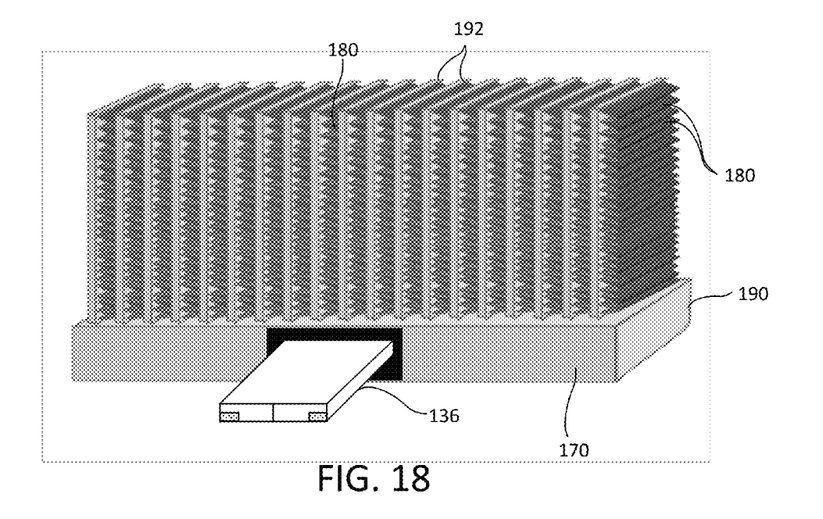
FIG. 18 illustrates a perspective view, cut away, of the other condenser.
Figure 19:
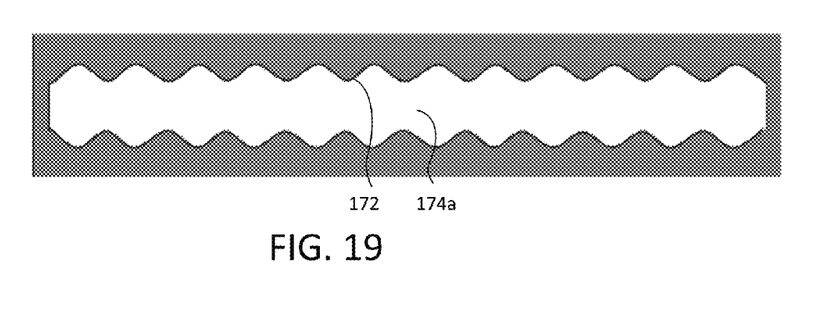
FIG. 19 is an expanded top view, cross-sectional, of a chamber in the condenser.

FIGS. 16-18, illustrate a second implementation of the condenser 134 that also has a plurality of heat conducting fins 180 that project outwardly from the body 170. However, in this implementation, the vertically-extending chambers 174a extend vertically from the central channel 176. In particular, the body can include a bottom header 190 which contains the central channel 176, and plurality of tubes 192 that project vertically from the bottom header 190 and contain the vertically-extending chambers 174a. The condensate line 136 is fluidically coupled to the bottom header 190 of the condenser 134.

Each chamber 174a can be formed by its own, and the walls 172 that form the boundaries of vertically extending chamber 174a can be walls of the tubes 192. The chambers 174a can extend perpendicular to the long axis of the body 170. Although the vertically extending chambers 174a are connected to a bottom header 190, the top ends of the chambers 174a can be closed off, i.e., the condenser 134 does not include a top header.

The fins 180 can project horizontally from the body 170, e.g., horizontally from the tubes 192. The fins 180 can extend parallel to the long axis of the bottom header 190. The fins 180 can be generally flat, narrow sheets. The fins 180 can project in parallel to each other from the body 170, and can be spaced apart, e.g., vertically spaced apart, with a regular pitch along a direction normal to their flat primary surfaces.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis parallel to the long-axis of the chambers 174a.

In either implementation of the condenser, both the body 170 of the condenser 134 and the fins 180 can be formed of a material with a good terminal conductivity, comparable or better than aluminum, e.g., of at least 200 W/mK. A nickel plating can be used to solder the fins 180 to the body 170, or the fins 180 can be brazed to the body 170.

Figure 20:
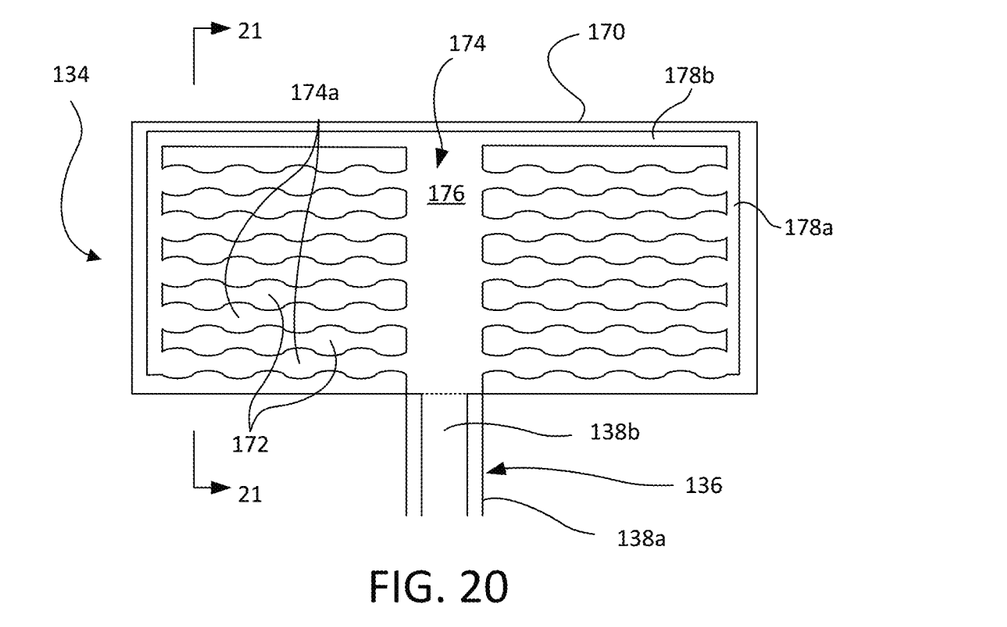
FIG. 20 illustrates a top view, cross-sectional, of another implementation of a condenser.
Figure 21:
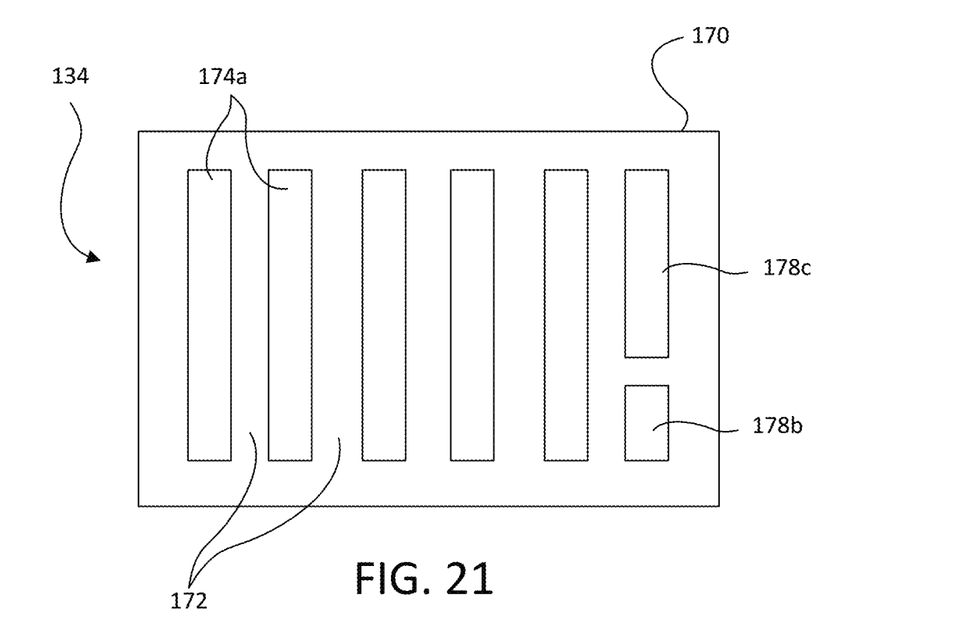
FIG. 21 illustrates a side view, cross-sectional, of the implementation of the condenser in FIG. 20.

Referring to FIGS. 20-21, in another implementation of the condenser, the ends of the chambers 174a further from the central channel 176 can be connected by a channel 178a. The channel 178a is fluidically connected by a channel 178b to an end of the central channel 176 further from the outer tube 138a. The channels 178a and 178b can be shorter than the chambers 174a, e.g., the channel 178a can be connected to the bottom of chambers 174a. Optionally, an additional laterally-extending chamber 178c can be positioned over the channel 178b to provide additional surface area for condensing. The condenser can otherwise be constructed similarly to the implementation shown in FIGS. 10-14. A potential advantage of this configuration is that at high flow capacity, fluid that would otherwise build up at the end of the chamber 174a farther from the central channel 176 and be unable to flow back due to vapor flow, can instead flow through the channels 178a and 178b and thus return to the outgoing outer passages 138a.

Referring to FIGS. 13, 16, 19 and 20, at least some interior surfaces of the condenser, e.g., surfaces that bound the cavity 174, can optionally be texturized. The texturization can apply to either implementation of the condenser. The cavity 174 provides an interior volume bounded by a substantially vertical interior surface, e.g., a surface of one of the walls 172. The texturization of the interior surface can include undulations projecting inwardly into the interior volume. The undulations can be uniform along a vertical first axis, and can project into the interior volume along a second axis perpendicular to the vertical first axis. Peaks of the undulations can be spaced apart, e.g., with a regular pitch, along a third axis perpendicular to the first axis and the second axis. The third axis can be parallel to the long axis of the body 170 and/or the chamber 174a. Each chamber 174a can have a length along the third axis and a width along the second axis with the length being greater than the width. The undulations can be smooth, e.g., no discontinuities in the surface along the second axis.

The undulations can have a pitch along the third axis between 0.1 and 1 mm and can have an amplitude along the second axis between 0.1 and 1 mm. In some implementations, a ratio of the pitch to the amplitude is between about 1:1 to 2:1. In some implementations, the undulations can form a sinusoidal wave. In some implementations, the undulations are formed by a plurality of curved segments in which dK/dS is equal to a constant value, where K is an inverse of the radius of curvature of the undulation and S is a distance along a curved segment. Other shapes for the undulations are possible. These undulations can cause thinning of the film of condensed working fluid that forms on the vertical interior surface, thereby reducing the thermal resistance of the condenser.

The working fluid can be a dielectric, non-flammable fluid with low toxicity, although but hydrocarbons such as methanol, ethanol or acetone can also be suitable. The composition of the working fluid and internal pressure of the thermosiphon system can be selected to provide a boiling point of the working fluid in the evaporator at about the desired operating temperature for the electronic devices, e.g., around 30-100° C., e.g., 45-55° C. Examples of the working fluid include Vextral XF sold by DuPont, Fluorinert Electronic Liquid FC-72, sold by 3M, and Novec 7100, sold by 3M.

The entire interior of the thermosiphon system 130, including the interior of the evaporator 132, condenser 134 and vapor/condensate line 136, are vacuum filled and sealed. Initial vacuum can be pulled to achieve an internal absolute pressure below 0.05 millibar (5 Pa) to remove air from the thermosiphon system 130, and then the working fluid can be introduced into thermosiphon system 130.

Although a server rack sub-assembly has been described above, the thermosiphon system could be used with heat-generating electronic devices mounted on a motherboard that is not part of a server rack sub-assembly, e.g., on a motherboard in a desktop computer, or could be used with heat-generating electronic devices that are not mounted on a motherboard. In some implementations, the evaporator fins could be replaced by a porous wicking material.

A number of embodiments of the invention have been described. Nevertheless, it will be understood that various modifications may be made without departing from the spirit and scope of the invention. Accordingly, other embodiments are within the scope of the following claims.

What is claimed is:

1. A thermosiphon system, comprising:
   a condenser;
   an evaporator including a chamber having a floor and a ceiling; and
   a condensate line fluidically coupling the condenser to the evaporator, the condensate line comprising a tube having a central passage and a pair of outer passages positioned adjacent a floor of the tube, positioned on opposite lateral sides of the central passage and extending parallel to the central passage, the central passage positioned to carry a vapor phase of the working fluid from the evaporator to the condenser, the pair of outer passages positioned to carry a liquid phase of a working fluid from the condenser to the evaporator, wherein the central passage includes a first portion positioned laterally between the pair of outer passages and a pair of second portions extending vertically over the pair of outer passages, the pair of outer passages separated from the second portions by partitions extending along a longitudinal length of the tube, and wherein a portion of the tube extends over the evaporator and apertures through the ceiling of the evaporator connect each of the pair of outer passages to the chamber of the evaporator, wherein the evaporator comprises a plurality of fins projecting upwardly from the chamber floor such that tops of the fins are positioned above the floor of the tube.

2. The thermosiphon system of claim 1, wherein the tube comprises a flattened rectangular body, the body having a width greater than its height.

3. The thermosiphon system of claim 2, wherein the outer passages are positioned adjacent side walls of the rectangular tube.

4. The thermosiphon system of claim 2, wherein the central passage extends from a top wall to a bottom wall of the rectangular tube.

5. The thermosiphon system of claim 1, wherein the tube comprises a support strut positioned in the central passage and extending along a length of the tube.

6. The thermosiphon system of claim 1, wherein the pair of outer passages has a cross-sectional area between 5-25% of the central passage.

7. The thermosiphon system of claim 1, wherein the tube comprises a unitary brazed body.

8. The thermosiphon system of claim 1, wherein the pair of second portions of the central passage extend laterally outward from the first portion of the central passage.

9. The thermosiphon system of claim 1, wherein the central passage and aperture are positioned such that the central passage carries primarily only the vapor phase of the working fluid.

10. A thermosiphon system, comprising:
a condenser;
an evaporator including an evaporator pan, the evaporating pan including a chamber having a floor and a ceiling and a plurality of projections extending upwardly from the floor of the evaporator pan; and
a condensate line fluidically coupling the condenser to the evaporator, wherein the condensate line includes a tube having a floor and a portion that extends over the evaporator and is separated from the chamber by a wall with a top surface of the wall providing the floor of the condensate line and a bottom surface of the wall providing the ceiling of the chamber such that the floor of the chamber is recessed relative to the floor of the condensate line, and wherein the plurality of projections extending upwardly from the evaporator pan through an aperture in the wall such that tops of the projections are positioned above the floor of the condensate line, wherein the condensate line comprises a tube having a central passage and a pair of outer passages positioned on opposite lateral sides of the central passage and extending parallel to the central passage, the central passage positioned to carry a vapor phase of the working fluid from the evaporator to the condenser, the pair of outer passages positioned to carry a liquid phase of a working fluid from the condenser to the evaporator.

11. The thermosiphon system of claim 10, wherein the plurality of projections comprise a plurality of fins.

12. The thermosiphon system of claim 11, wherein the plurality of fins are arranged in parallel.

13. The thermosiphon system of claim 11, wherein the fins have undulations along their length.

14. The thermosiphon system of claim 13, wherein the undulations have a pitch between 1 and 2 mm and an amplitude between 0.1 and 0.5 mm.

15. The thermosiphon system of claim 10, wherein the evaporator and the condensate line comprises a unitary brazed body.

16. The thermosiphon system of claim 10, wherein the evaporator pan and projections comprise copper.

17. The thermosiphon system of claim 10, wherein each of the pair of outer passages has an aperture positioned over or adjacent the evaporator pan.

18. The thermosiphon system of claim 11, wherein the tops of the fins are spaced apart from a ceiling of the condensate line.

* * * * *